US006975664B1

(12) United States Patent
Dodabalapur et al.

(10) Patent No.: US 6,975,664 B1
(45) Date of Patent: Dec. 13, 2005

(54) ARTICLE COMPRISING A TWO-DIMENSIONAL PHOTONIC CRYSTAL COUPLER AND METHOD OF MAKING THE SAME

(75) Inventors: Ananth Dodabalapur, Millington, NJ (US); Attila Mekis, Cambridge, MA (US); John A. Rogers, New Providence, NJ (US); Richart Elliott Slusher, Lebanon, NJ (US)

(73) Assignee: Agere Systems Inc., Berkeley Heights, NJ (US)

( * ) Notice: Subject to any disclaimer, the term of this patent is extended or adjusted under 35 U.S.C. 154(b) by 0 days.

(21) Appl. No.: 09/480,409

(22) Filed: Jan. 11, 2000

Related U.S. Application Data

(63) Continuation-in-part of application No. 09/385,167, filed on Aug. 30, 1999, now Pat. No. 6,363,096.

(51) Int. Cl.[7] .............................. H01S 3/08; G02B 6/02
(52) U.S. Cl. ...................................... 372/102; 385/125
(58) Field of Search ................................ 372/50, 45, 6, 372/96, 75, 9, 43, 102, 92; 350/96; 385/14, 385/15, 123–125

(56) References Cited

U.S. PATENT DOCUMENTS

| | | | | |
|---|---|---|---|---|
| 4,286,232 A | * | 8/1981 | Puech et al. ................... 372/43 |
| 4,318,058 A | * | 3/1982 | Mito et al. ..................... 372/50 |
| 4,464,762 A | * | 8/1984 | Furuya .......................... 372/50 |
| 4,904,045 A | * | 2/1990 | Alferness et al. ............. 350/96 |
| 5,220,573 A | * | 6/1993 | Sakata et al. .................. 372/50 |
| 5,233,187 A | * | 8/1993 | Sakata et al. .......... 250/227.24 |
| 5,410,622 A | * | 4/1995 | Okada et al. .................. 385/14 |
| 5,444,730 A | * | 8/1995 | Mizutani ...................... 372/45 |
| 5,673,284 A | * | 9/1997 | Congdon et al. ............. 372/50 |
| 5,881,089 A | * | 3/1999 | Berggren et al. ............. 372/96 |
| 5,910,256 A | * | 6/1999 | Tsunetomo et al. ........... 216/24 |
| 5,999,308 A | * | 12/1999 | Nelson et al. ............... 359/321 |
| 6,064,783 A | * | 5/2000 | Congdon et al. ............. 385/15 |
| 6,111,902 A | * | 8/2000 | Kozlov et al. ................ 372/39 |
| 6,263,002 B1 * | | 7/2001 | Hsu et al. ...................... 372/6 |
| 6,301,420 B1 * | | 10/2001 | Greenaway et al. ........ 385/126 |
| 6,334,017 B1 * | | 12/2001 | West .......................... 385/123 |
| 6,334,019 B1 * | | 12/2001 | Birks et al. .................. 385/125 |
| 6,363,096 B1 * | | 3/2002 | Dodabalapur et al. ........ 372/75 |
| 6,366,598 B1 * | | 4/2002 | Nichols et al. ............. 372/102 |
| 6,404,966 B1 * | | 6/2002 | Kawanishi et al. ......... 385/125 |
| 6,410,416 B1 * | | 6/2002 | Dodabalapur et al. ...... 438/615 |
| 6,487,328 B2 * | | 11/2002 | Butler et al. .................. 385/14 |
| 6,496,632 B2 * | | 12/2002 | Borrelli et al. ............. 385/123 |

(Continued)

OTHER PUBLICATIONS

Atilla Mekis, Two-dimensional photonic crystal couplers for unidirectional light output, Jul. 1, 2001, Optics Letters, vol. 25, No. 13.*

(Continued)

*Primary Examiner*—Minsun Oh Harvey
*Assistant Examiner*—Phillip Nguyen
(74) *Attorney, Agent, or Firm*—Polster, Lieder, Woodruff & Lucchesi, L.C.

(57) ABSTRACT

A two-dimensional photonic crystal coupler is disclosed, together with a cross-coupled laser structure that is based on a two-dimensional photonic crystal coupler stage. Unlike traditional grating couplers, this two-dimensional photonic crystal coupler can couple light into a single or a plurality of discrete directions in the far-field, i.e., the output light may be unidirectional or discrete. The coupler can be integrated with one-dimensional lasers, a distributed feedback laser, a distributed Bragg reflector laser, and integrated on the same waveguide as the lasers. A resonant cavity coupler design improves the coupling efficiency of two-dimensional photonic crystal-based couplers.

18 Claims, 6 Drawing Sheets

U.S. PATENT DOCUMENTS 6,539,155 B1 *  3/2003  Broeng et al. .............. 385/125
6,847,771 B2 *  1/2005  Fajardo et al. .............. 385/125

OTHER PUBLICATIONS

Masahiro Imada, Coherent two-dimensional lasing action in surface-emitting laser with triangular-lattice photonic crystal structure, Jul. 19, 1999, Applied Physics Letters, vol. 75, No. 3.*

A. Katzir et al., Appl. Phys. Lett., 30, 225, (1977), pp. 225-226.

D. Heitmann et al., Appl. Phys. Lett. 37, (1980), pp. 585-587.

Hatakoshi et al., Appl. Opt. 23, (1984), pp. 1749-1753.

P. Borsboom et al., J. Opt. Soc. AM, A12, (1995), pp. 1142-1146.

A. Dodabalapur et al., "Organic Solid-State Lasers: Past and Future," Science, vol. 277 (Sep. 19, 1997), pp. 1787-1788.

Feng et al., "Grating-Assisted Surface-Emitting Laser Transmitter with Image-Forming Capability" IEEE Photonics Tech. Letters, vol. 10, No. 12 (Dec. 1998), pp. 1682-1684.

M. Meir et al., Appl. Phys. Lett. 86, 3502 (1999), pp. 3502-3507.

A. Dodabalapur, "Resonators and Materials for Organic Lasers Based on Energy Transfer," IEEE J. of Selected Topics in Quan. Elec., vol. 4, No. 1 (Jan./Feb., 1998), pp. 67-74.

A. Dodabalapur et al., "Physics and Applications of Organic Microcavity Light Emitting Diodes," J. Appl. Phys. vol. 80, (12) (Dec. 15, 1996), pp. 6954-6964.

* cited by examiner

ARTICLE COMPRISING A TWO-DIMENSIONAL PHOTONIC CRYSTAL COUPLER AND METHOD OF MAKING THE SAME

RELATED APPLICATIONS

This application is a continuation-in-part of U.S. patent application Ser. No. 09/385,167 filed Aug. 30, 1999 (issued as U.S. Pat. No. 6,363,096 on Mar. 26, 2002), which is incorporated herein by reference.

FIELD OF THE INVENTION

The present invention relates to a photonic crystal coupler and more particularly, to an article comprising a two-dimensional photonic crystal coupler which advantageously is integrated with one or more one-dimensional photonic crystal lasers.

BACKGROUND OF THE INVENTION

Couplers are important devices for many communication applications and in integrated photonic circuits. Couplers are needed to combine or separate signals and to interconnect the various points of a communications network. The are many constraints involved with coupler design, however. Such constraints include the laser structure with which the coupler may be used, the number of ports, sensitivity to light transmission direction, wavelength selectivity, type of fiber, signal attenuation, and cost. High-power distributed feedback (DFB) lasers are light sources of choice in many optical communications systems, which makes coupling the laser light out of planar waveguides and possibly into fibers a crucial technological issue. Traditionally, one-dimensional grating couplers (GCs) and focusing GCs have been used to couple laser light out of a waveguide plane and achieve coherent scattering of the light. See, e.g., A. Katzir et al., APPL. PHYS. LETT. 30, 225 (1977); Loewen et al., DIFFRACTION GRATINGS AND APPLICATIONS (M. Dekker, NY 1997); D. Heitmann et al., APPL. PHYS. LETT. 37, 585 (1980); Hatakoshi et al., APPL. OPT. 23, 1749 (1984); P. Borsboom et al., J. OPT. SOC. AM. A12, 1142 (1995).

There are drawbacks, however, with such one-dimensional gratings, particularly with regard to the directionality of the output light. The direction of the output light naturally affects how well the light may be coupled into receivers or other devices, e.g., planar waveguides and fibers. Both one-dimensional grating couplers and focusing grating couplers have periodicity in a single spatial direction. One-dimensional GCs have straight grooves, whereas focusing GCs, also called grating lenses, have a curvelinear grating. The direction of light output from a coupler is determined by phase-matching the scattered wave to the guided wave. As shown in FIG. 1A, a one-dimensional grating couplers e.g. 1 couple light to a cylindrical wave, necessitating the use of additional optics to direct the light into a fiber. As shown in FIG. 1B, focussing grating couplers e.g. 3 focus light to a point 4 in space in the vicinity of the grating at a distance on the order of the grating size. With focusing couplers, a receiver may only be placed at a certain fixed distance from the coupler, and in the far field, light is coupled to a spherical wave.

Additionally, semiconductor lasers using organic or polymeric materials and electrically-driven laser action have recently attracted a great deal of interest. Organic solid-state lasers have the potential to provide a compact low-cost laser source over a broad range of wavelengths throughout the visible spectrum. Organic lasers also influence research in other areas and have led to advances with both organic and inorganic semiconductor lasers, as described in A. Dodabalapur et al., "*Organic Solid-State Lasers: Past and Future,*" SCIENCE Vol. 277 (Sep. 19, 1997), at pp. 1787–1788, incorporated herein, and in U.S. patent application Ser. No. 09/385,167, referenced above (hereinafter the "'167 application").

Examples of advances in organic or inorganic semiconductor lasers include the successful realization of distributed feedback (DFB) and distributed Bragg reflector (DBR) lasers with dye-doped polymers and the widespread use of InP-based DFB and DBR lasers. Such lasers exhibit superior single frequency operation and high-speed modulation characteristics, e.g., as compared with Fabry-Perot lasers. DFB and DBR are deployed in many commercial systems including long-haul fiber optic communication systems. An assembly comprising a DBR or DBF laser monolithically integrated with an off-plane computer-generated waveguide hologram and semiconductor amplifier is disclosed in Feng et al., "*Grating-Assisted Surface-Emitting Laser Transmitter with Image-Forming Capability*" IEEE Photonics Tech. Letters, Vol. 10, No. 12 (December 1998). Feng et al. define their computer-generated hologram as "essentially a surface relief grating-like" structure the design of which is not clearly defined.

DFB and DBR lasers are examples of one-dimensional photonic-crystal lasers since they possess one-dimensional gratings as part of their structure. One-dimensional photonic crystal lasers provide many advantages. For example, the density of states is sharply peaked at the edges of the air and dielectric bands, leading to low thresholds. Although two-dimensional photonic crystal lasers have been demonstrated {see, e.g., M. Meier et al., APPL. PHYS. LETT. 86, 3502 (1999), which is incorporated herein}, for many applications one-dimensional lasers remain preferred.

As may be appreciated, those involved in the field of communications systems and semiconductor devices continue to seek to develop new designs to improve device efficiency and performance and to allow for the use of new materials, such as GaN and plastics. In particular, it would be advantageous to provide a coupler that avoids the directionality restraints of one-dimensional and focusing GCs that is compatible with one-dimensional photonic crystal lasers such as DFB and DBR lasers.

SUMMARY OF THE INVENTION

Summarily described, the invention comprises an article that includes a two-dimensional photonic crystal coupler. The coupler comprises a core region disposed between two cladding regions, in which the core region has a grating formed in two-dimensions. Unlike traditional grating couplers, this two-dimensional photonic crystal coupler can couple light into a single or a discrete number of directions in the far-field. The coupler can be integrated with one-dimensional lasers, a distributed feedback laser, a distributed Bragg reflector laser, and integrated on the same waveguide as the lasers. The coupler can also be ensconced with other optical components (such as gratings) to form composite devices which effectively function as lasers with unique output coupling characteristics.

BRIEF DESCRIPTION OF THE DRAWINGS

To illustrate the invention, there is shown in the drawings a form of the invention which is presently preferred, it being understood, however, that the invention is not limited to the precise arrangements and instrumentalities shown.

DETAILED DESCRIPTION OF THE INVENTION

With this invention, a two-dimensional photonic crystal grating coupler is provided that achieves dramatic advantages over traditional GCs in coupling directionality. Unlike traditional grating couplers, this two-dimensional photonic crystal coupler can couple light into a single or a discrete number of directions in the far-field; that is, the output light may be unidirectional or follow a plurality of discrete directions. Additionally, the inventive coupler can be integrated on the same waveguide as a one-dimensional laser, such as an organic DFB laser and fabricated together with the laser, thus realizing the advantages of both the one-dimensional laser and the two-dimensional coupler.

Figure 1A:
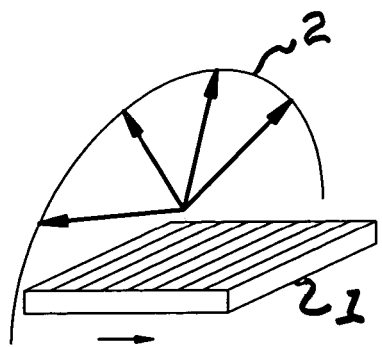
FIGS. 1A and 1B are schematic illustrations representing the directional output from one-dimensional grating and focusing couplers, respectively.
Figure 1B:
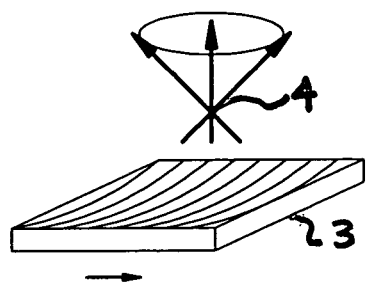
Figure 2:
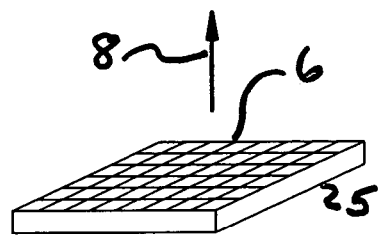
FIG. 2 is a schematic illustration representing the directional output from a two-dimensional grating coupler.

With the two-dimensional grating coupler, a core region is disposed between two cladding regions, in which the core region receives light from a first device and outputs light to a second device, i.e., the index of refraction of the core relative to the cladding is such that there is internal reflection of light at the core. As shown in FIG. 2, in a two dimensional grating coupler 5, 6, the core region has a grating formed in two-dimensions. Introduction of periodicity in this additional spatial direction increases the number of constraints on the output angles. Light is then-coupled out into a single or a number of discrete directions, as schematically illustrated in FIG. 2. In other words, light is not output in a cylindrical or spherical wave, as with the one-dimensional GCs of the prior art (e.g., as in FIGS. 1A–1B), but rather, it is unidirectional or follows a plurality of discrete paths. The two-dimensional coupler is a dramatic improvement over traditional grating couplers in coupling directionality.

The discussion below is divided into five parts. In part A, the coupling mechanism in two-dimensional photonic crystal couplers and the effect of design parameters on output directions are described. In Part B, numerical simulations are used to calculate coupling constants for a photonic crystal coupler in an exemplary waveguide structure. In Part C, examples are set forth for use of the photonic crystal coupler in conjunction with a one-dimensional laser and integration of the laser and coupler during fabrication. In Part D, an exemplary method of making the laser-coupler device is described. Then in Part E, contemplated applications for use of the two-dimensional photonic crystal coupler and the laser-coupler configuration are discussed.

A. Coupling Mechanism and Effect of Design Parameters on Output Directions

Factors applicable in designing a two-dimensional photonic crystal coupler may be analyzed by considering a grating in a planar dielectric waveguide on top of a substrate. Let the wavevector of the waveguided mode incident on the grating section be k, its free-space wavelength λ, the in-plane component of the scattered radiation wavevector K, and the polar angle of the output direction θ. If the number of periods in the grating is large, the field scattered by the grating will interfere constructively only in certain directions. The phase-matching condition is $$k = K + G \tag{1}$$

where G is a reciprocal lattice vector by which the lattice diffracts the propagating mode out of the guide. The azimuthal angle of the radiation direction is easily determined from (1) and the polar angle from the same equation as $$\sin \theta = \lambda |k - G|/2\pi n \tag{2}$$

where n is the refractive index of the medium (air or substrate) into which the radiation is emitted.

Figure 3:
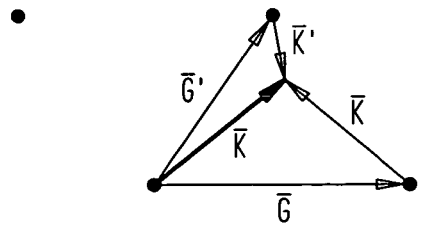
FIG. 3 is a schematic illustration reflecting the phase-matching condition in a reciprocal lattice of a triangular two-dimensional photonic crystal coupler.

The two-dimensional coupler may take many shapes and be fabricated with a variety of materials (as further described below); however, equations (1) and (2) above may be applied generally in designing the two-dimensional coupler and selecting the correct lattice parameters to achieve coupling in a desired direction. FIG. 3 illustrates the phase-matching condition in a reciprocal lattice of a triangular two-dimensional photonic crystal coupler for a guided mode wavevector. The emitted radiation is in two directions K, K' so this grating acts as a two-way splitter. Light is emitted into one half-space into two directions, with different azimuthal and polar angles. This is not possible with a traditional one-dimensional GC. Since sin θ<1, there are only a finite number of reciprocal lattice vectors that satisfy Equation (2).

Figure 4A:
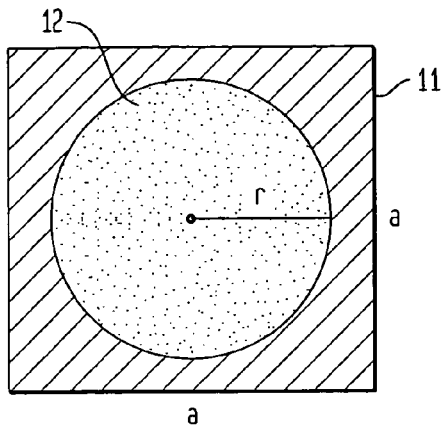
FIGS. 4A and 4B are cut-away cross-sectional top and side views, respectively, of a waveguide structure comprising a two-dimensional photonic crystal coupler and laser.
Figure 4B:
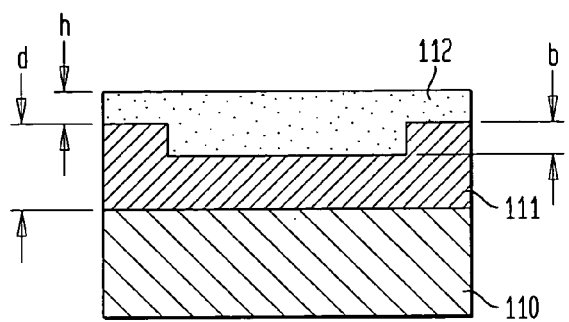

B. Numerical Simulations For Calculating Coupling Constants For A Photonic Crystal Coupler In An Exemplary Waveguide Structure The coupling constants for a photonic crystal coupler can be determined explicitly. Consider for example a waveguide structure consisting of two layers disposed on a silicon substrate, partially illustrated in FIGS. 4A–4B, in which a two-dimensional coupler functions as both a laser and a coupler (thus, the laser is a two-dimensional laser). FIGS. 4A–4B showing the same cut-away sections of this exemplary waveguide structure, wherein FIG. 4A shows a top view (i.e., of one lattice hole), and FIG. 4B shows a cross-sectional side view of the hole. The waveguide structure has a SiO$_2$ substrate 110 (with a refractive index n=1.46), and two overlying layers 111, 112, comprising a first layer 111 of 100 nm thick Si$_3$N$_4$ (with a refractive index n=2.0) and a second layer 112 of an organic material (with a refractive index n=1.7). The lattice holes for forming the grating of the photonic crystal coupler are etched into the Si$_3$N$_4$ layer before sublimation of the second layer 112 so that the organic material will fill the holes comprising the grating. The photonic crystal is selected in this example to be a square lattice of holes with lattice constant a, hole radius r=0.375a, and hole depth b. However, vertical coupling can also be achieved using other kinds of lattices, such as triangular, rectangular, honeycomb, etc.

In this example, the lattice parameters are chosen as follows. To satisfy Equation (2) for vertical emission ($\theta$=0), k must be a reciprocal lattice vector. For only vertical emission into both substrate and air, the right-hand-side must be larger than 1 for |k−G|>0. This is possible when a<$\lambda$/n. In terms of the guide effective index n$_c$, ka/2$\pi$<n$_c$/n must hold for both substrate and air refractive indices n. In this example, $\lambda$=650 nm, n$_c$=1.63 and n=1.46; consequently, k=2$\pi$/a. This yields a lattice constant a=400 nm, which is achievable with lithographical methods. If the index contrast between the guide and the substrate is larger than set forth in this example and the ratio n$_c$/n is greater, several feasible lattice constants could be selected.

The next step is to calculate the coupling constant for the waveguide grating. For simplicity, let the guided mode propagation direction be x, and let the grating have length L$_x$ in this direction. As the mode propagates, its intensity decays exponentially due to scattering losses. The amplitude coupling constant $\alpha$ is defined as one half of the fractional change in the power flux P along the guide. The power flux and the energy E per unit length are related to the group velocity v$_g$ of the waveguide without the grating through $$P = v_g E / L_x \quad (3)$$

and the total radiated power scattered by the grating is P$_s$=dEdt. Therefore we can express $\alpha$ in terms of E as $$\alpha = -\frac{1}{2P}\frac{dP}{dx} = -\frac{1}{2P}\frac{P_s}{L_x} = \frac{1}{2v_g}\frac{d(\ln E)}{dt} \quad (4)$$

In these numerical simulations, Maxwell's equations may be solved using a finite-difference scheme on a three-dimensional rectangular grid. See, e.g., K. S. Kunz et al., THE FINITE DIFFERENCE TIME DOMAIN METHOD FOR ELECTROMAGNETICS (CRC press, Boca Raton 1993). The grid is periodic in the x- and y-directions and contains one unit cell of the photonic crystal slab. In the z-direction, the cell is terminated by a second-order Mur's absorbing boundary condition. A TE polarized dipole source with a Gaussian time-profile placed in the center of the slab excites a guided mode of the slab. The energy in the cell and the flux through the top and bottom are measured as a function of time. The cell is long enough in the z-direction so that the escaping flux due to the finite extent of the cell is negligible compared to the energy in the mode for a slab without the grating.

The excited mode is a superposition of two counter-propagating waves. The grating has a plane of symmetry perpendicular to the propagation direction x. The two propagating modes combine to give a mode that is symmetric and one that is asymmetric with respect to reflection through this plane. The asymmetric mode cannot couple to free-space plane waves, so no energy is lost from the slab when this mode is excited. The symmetric mode, however, loses energy at twice the rate of the propagating mode. In contrast to one-dimensional gratings, modes can combine in a more complicated fashion; for instance, four modes, or even six, can mix in a triangular lattice.

We observe an exponential decay of the energy of the symmetric mode excited by the pulse, as expected. We use equation (4) to determine 2$\alpha$ from the decay constant. The unperturbed waveguide for which v$_g$ is used in (4) is not simply the original waveguide with b=0 but is defined by the zeroth order component in the Fourier decomposition of the dielectric constant. For fixed b, this is a waveguide with b=0 and effective organic thickness h=h$_e$=50 nm+$\pi$r$^2$b and d=150 nm−h. The resulting group velocity found from the dispersion relation for this waveguide fits very well in the formula v$_g$/c=0.508+(b+0.125)$^2$, where b is given in units of $\mu$m.

Figure 5:
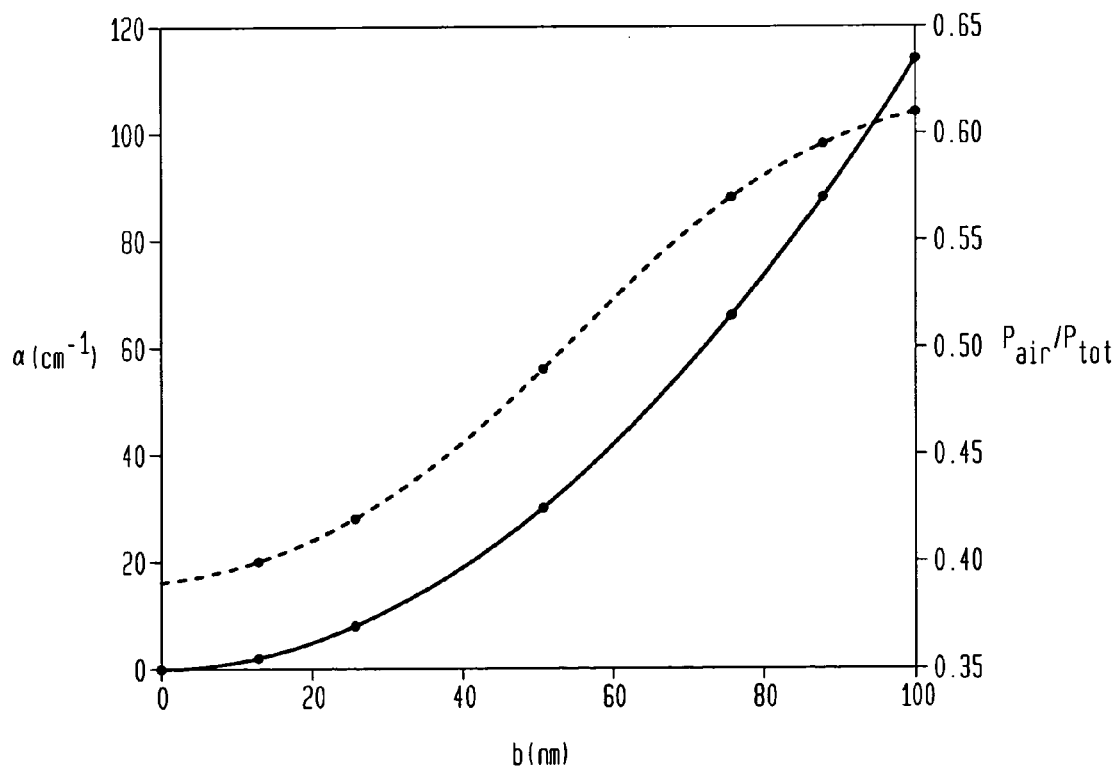
FIG. 5 is a plot of the coupling constant and the ratio of the power coupled into air to the total scattered power, both as a function of grating depth, for the coupling structure of FIGS. 4A–4B.

FIG. 5 is a plot of the resulting coupling constant and the ratio of the power coupled into air to the total scattered power, both as a function of the grating depth. The dashed line reflects power coupled into air divided by the total power coupled out of the guide, and the solid line reflects alpha. For small b, the increase is quadratic. At its maximum, the coupling constant exceeds 110 cm$^{-1}$. Even though this coupling constant would still require a grating of length≅100 $\mu$m, the coupler size can be reduced by ensconcing the photonic crystal coupler within one-dimensional gratings at each end to realize a resonant-cavity coupler. The beam divergence of the emitted light beam is on the order of $\lambda$/nL, where L is the size of the grating in the direction in which the beam divergence is measured. For a 30 $\mu$m×30 $\mu$m grating this is about 10 for radiation into air, thus enabling compact and very efficient photonic crystal couplers. The size of the couplers may be reduced even further allowing for facile and efficient coupling into single-mode fibers.

The coupling efficiency as shown in FIG. 5 increases with b and exceeds 60% at the maximum depth considered. Since at b=0 the ratio is undetermined, the efficiency for small b was obtained from interpolation using a structure with b<0, that is, a Si$_3$N$_4$ cylinder of height-b protruding into the organic layer. The increase with b and the turnoff at large grating depth can be understood by considering the scattering due to the perturbation as a source of a plane wave in the Si$_3$N$_4$ layer. The coefficient of transmission into air through an organic layer of effective thickness h$_e$, and index n has maxima at h$_e$=N$\pi$c/2$\omega$n, N being an odd integer. From this picture we expect transmission to be approximately sinusoidal as he changes, with a maximum at h$_e$=96 nm, or b=103 nm (from N=0). This is in good qualitative agreement with the calculated coupling efficiency.

As can be seen, two-dimensional photonic crystal couplers can couple light into a discrete number of directions in the far-field. The two-dimensional photonic crystal couplers can effect unidirectional coupling and compact photonic crystal couplers with short coupling lengths (<30 $\mu$m) and small beam divergences (<5 degrees) can be realized and fabricated together with planar DFB lasers. Because of the time-reversibility of Maxwell's equations, light can be coupled into planar waveguides with the same type of photonic crystal couplers from vertically emitting sources, such as vertical cavity surface emitting lasers.

C. Exemplary Photonic Crystal Coupler and One-Dimensional Laser Structures

Figure 6A:
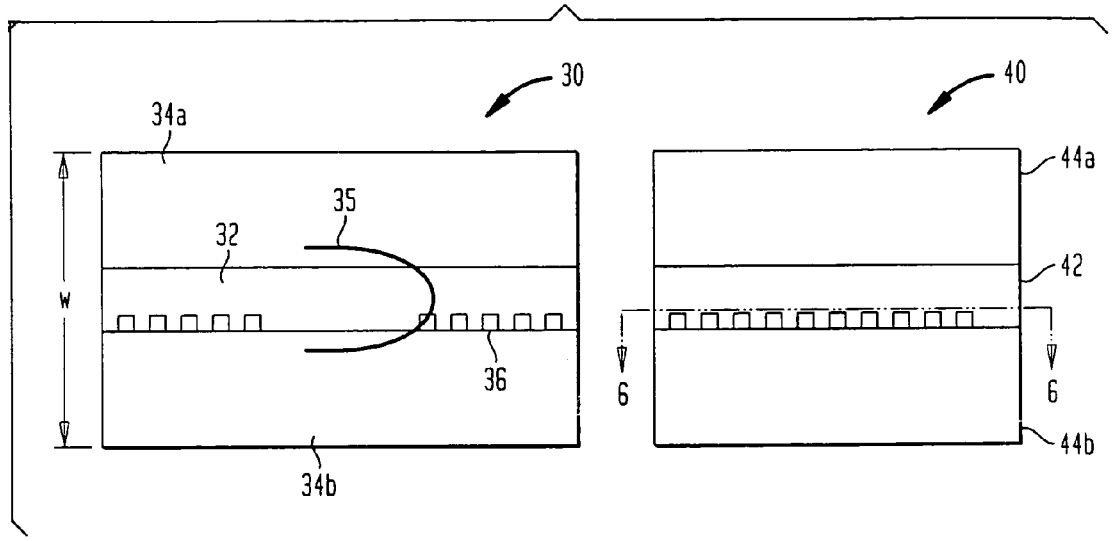
FIG. 6A is a schematic cross-sectional side view of the waveguide laser-coupler device.

A single one-dimensional photonic crystal laser (e.g., DBR laser), may be integrated with the two-dimensional coupler. For example, FIG. 6A is a schematic cross-sectional side view of the coupler integrated with a laser. The waveguide laser 30 has a core region 32 comprised of a material having a first index of refraction surrounded by cladding layers 34a, 34b having a second index of refraction lower than the first so that light pumped into the core region 32 will be guided therein (e.g., along the guided mode 35), by total internal reflection. Within the core region 32 of the laser is fabricated a one-dimensional grating 36. The laser 30 is joined with coupler 40, having core region 42, cladding regions 44a, 44b, and a two-dimensional grating 46 formed in the core.

Figure 6B:
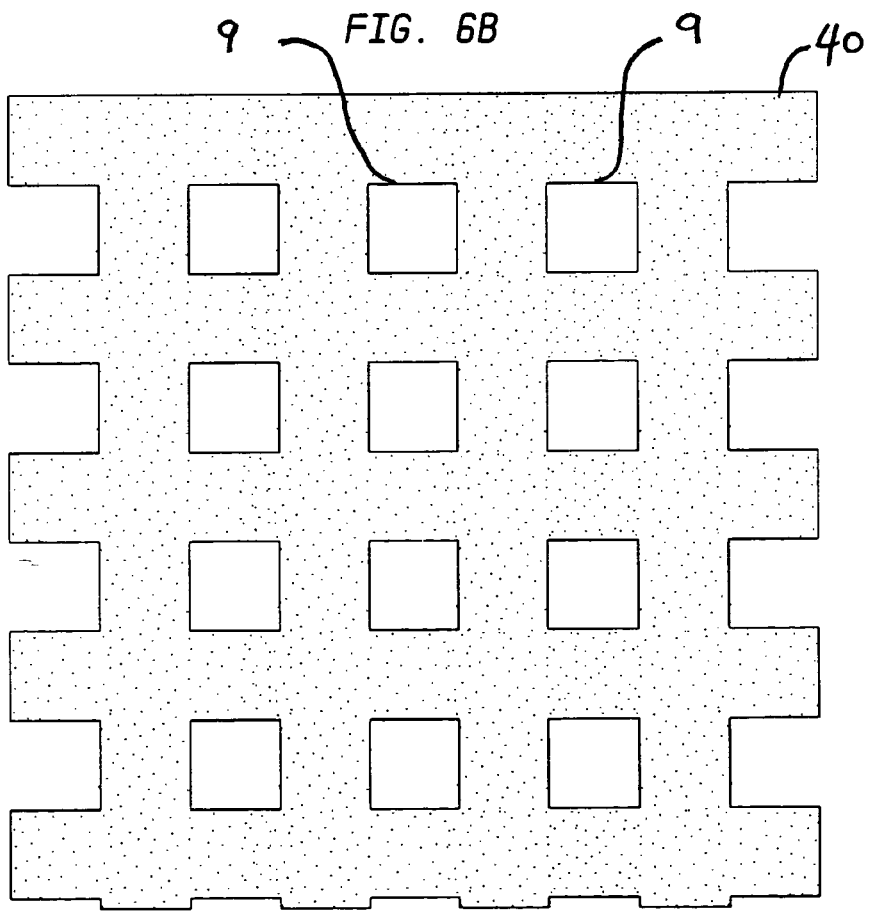
FIG. 6B is a schematic view taken along the cross-sectional line 6—6 of FIG. 6A.

The laser 30 and coupler 40 share a common waveguide and can be formed on the same substrate. When the laser has a high absorption coefficient (in the unpumped state), it may be advantageous to use a slightly different material composition in the coupler to reduce absorption losses, as the coupler is not pumped. For example, the coupler may have a loss coefficient smaller than the coupling constant. A design guideline is that the loss coefficient of the coupler is <10 cm$^{-1}$. FIG. 6B shows a schematic cross-sectional top view of the coupler 40 of FIG. 6A, along the cross-sectional line 6—6 of FIG. 6A, showing preferred parameters for coupling. In particular, as shown in FIG. 6B, for a square lattice the distance spanning the side of each square of the lattice is 0.22 μm and the distance from one corner of one square to the proximal corner of the next adjacent square is 0.44 μm.

Figure 7:
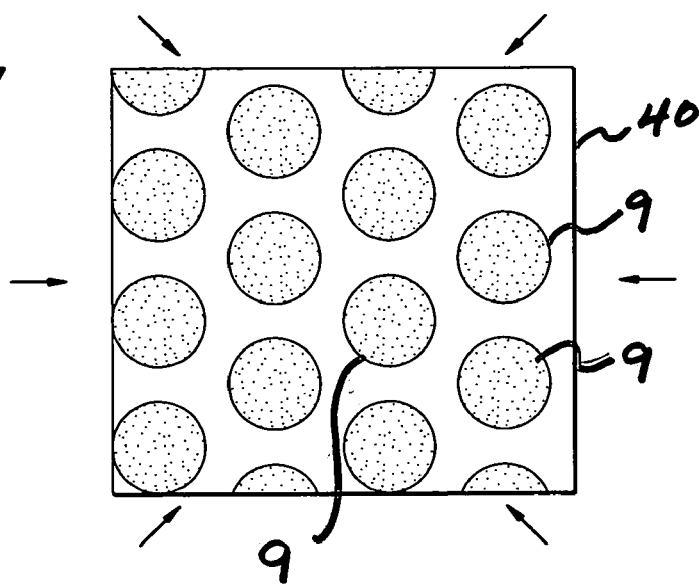
FIG. 7 schematically illustrates a top view of a two-dimensional triangular lattice coupler integrated with six lasers.

Additionally, a plurality of one-dimensional photonic crystal lasers may be integrated with the same coupler. In this case, the coupler functions as a mixer as well as a coupler. The number of lasers and orientation relative to the coupler should be selected so that the two-dimensional character of the coupler is retained. For example, when a coupler 40 having a two-dimensional triangular lattice of grating elements 9 is used, six lasers may be combined at directions that are 60 degrees apart relative to each other. Such an arrangement is schematically shown in FIG. 7, in which each arrow represents the path of light emitted from a laser that is integrated with the coupler. In this embodiment, all six modes can mix. The parameters of the two-dimensional lattice will affect the number of points in real space that the laser emissions are coupled to. For example, when a two-dimensional lattice with square symmetry is used, mixing and combining of the modes can occur along four directions may be used, and also, the emissions from all six lasers can be directed vertically, which is advantageous for high-powered lasers.

The two-dimensional photonic crystal coupler also may be ensconced within the one-dimensional laser structure. In other words, the coupler can be fabricated as a "defect" in a one-dimensional photonic crystal laser, and the gratings of the one-dimensional photonic crystal laser function as mirrors which create a "resonant cavity coupler." For example, the two-dimensional photonic crystal coupler can be ensconced between two DBR mirrors. In this case, the two-dimensional coupler is formed with a square lattice. The width of the waveguide (which runs substantially perpendicular to the Bragg mirrors) can be reduced to dimensions that are sufficiently small to function in single mode. The dimension of the waveguide will depend on the wavelength and materials. For example, at a wavelength of 700 nm, a III–IV semiconductor laser can function as a single-mode laser when the width of the waveguide is about 2–3 microns, wherein the "width" denotes the dimension perpendicular to the direction of light propagation and parallel to the plane of the layers (core, cladding, etc.) (e.g., illustrated in FIG. 6A with reference "w").

The length of the coupler advantageously is approximately the same as the width of the waveguide. The coupling constant of the two-dimensional photonic crystal may be small (e.g., about 100 cm$^{-1}$) such that over a coupler length of 2–3 microns, a small fraction (e.g., about 2 percent) of the guided light can be outcoupled. However, the resonant structure will enhance the amount of coupling.

D. Method of Making the Laser-Coupler Device

Figure 8A:
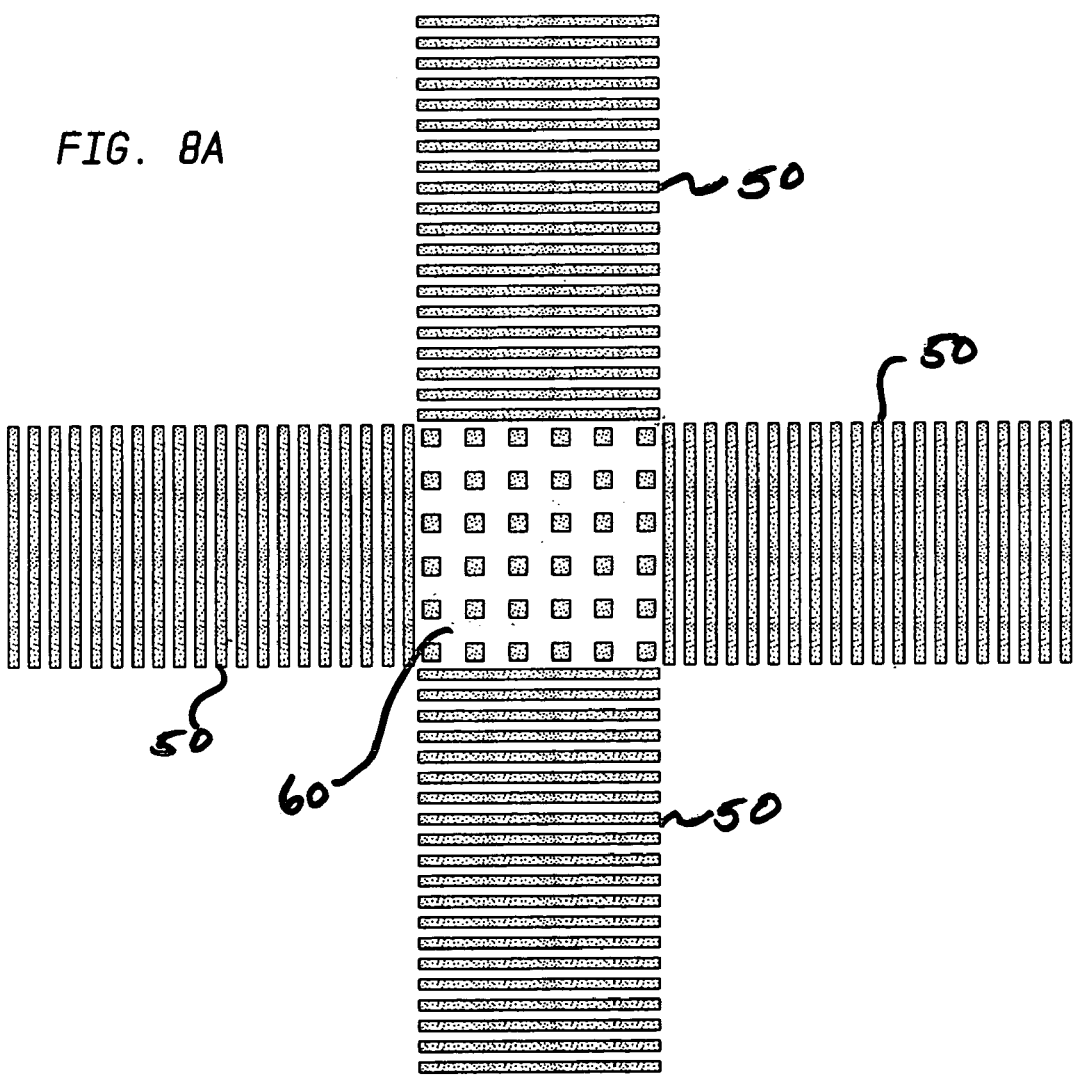
FIG. 8A is a schematic illustration of a pattern for a photoresist layer for use in making the two-dimensional coupler ensconsed within a pair of DBR lasers.

By way of example, a two-dimensional coupler can be ensconsed within two DBR lasers for use as a dielectric waveguide as follows. A silicon substrate is provided and coated with a thick layer (e.g., about 4 micrometers in thickness) of SiO$_2$ having a refractive index of about 1.5 A photoresist is applied to the Si/SiO$_2$ structure and patterned as shown in FIG. 8A. The exposed portions of the sample (i.e., not covered by the photoresist) are then etched, applying methods known in the field for etching photoresist. For example, the sample may be etched by a plasma with CHF$_3$ for about 2 minutes at a pressure of about 30 mTorr and a plasma voltage of about 300 V which typically etches to a depth of about 30 nm in the SiO$_2$ layer. The photoresist is then removed, applying methods known in the field, e.g., by use of an oxygen plasma. A pattern is thus formed on the sample that is inverse of the pattern shown in FIG. 8A, to produce first order grating regions 50, and second order (square lattice) grating region 60. The photoresist preferably is applied and the sample etched to produce a periodicity of 210 nm for the first order grating and 420 nm for the second order grating. Of course, other patterns may be used to form gratings with different structures. In integrating a two-dimensional coupler with a one-dimensional laser, basically a two-dimensional latticed pattern is formed adjacent at least one one-dimensional linear pattern.

Figure 8B:
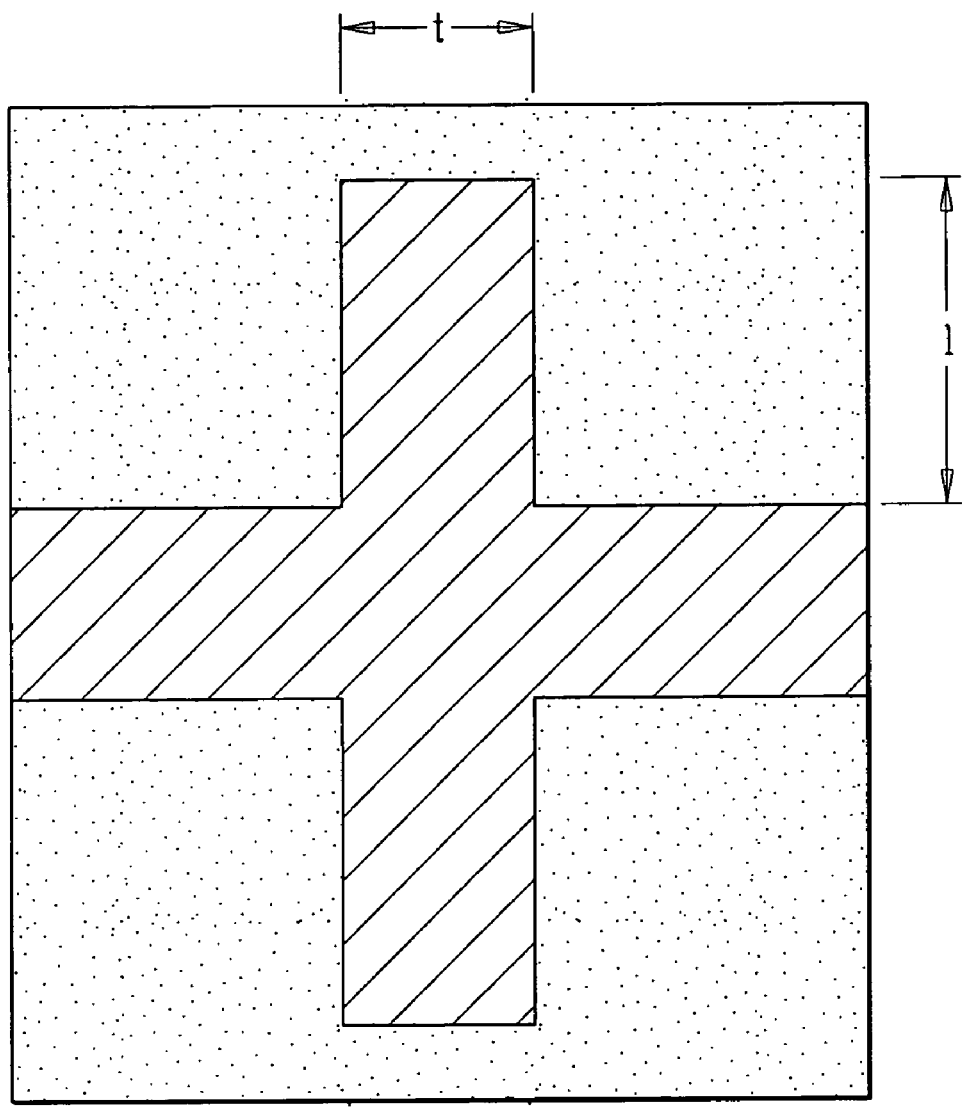
FIG. 8B is a schematic illustration of a second pattern and dimensions for a photoresist layer for use in making the two-dimensional coupler ensconsed within a pair of DBR lasers.

The sample is again coated with thick photoresist and patterned to form a cross-shaped pattern as illustrated in FIG. 8B. As shown in FIG. 8B, each of the arms of the cross are substantially equally-sized and about 2 or 3 μm thick (t=2–3 μm) and about 25 μm long (I=25 m). The sample is then etched to a depth of about 3 micrometers, with the photoresist protecting the grating patterns previously defined. The photoresist is then removed, applying known methods, to expose the one- and two-dimensional grating regions.

A thin film (e.g., ~200 nm) of 8 hydroxyquinoline aluminum (Alq) doped with 1% by weight of DCM (a laser dye available from Exciton Inc.) is deposited above the structure. The optical properties of Alq doped with DCM and its use as a laser gain medium are described in the literature, and suitable compositions and mixtures for use as the gain medium are further described in A. Dodabalapur, "*Resonators and Materials for Organic Lasers Based on Energy Tranfer*," IEEE J. OF SELECTED TOPICS IN QUAN. ELEC., Vol. 4, No. 1 (January/February 1998), which is incorporated herein by reference. Alq doped with DCM has a refractive index of about 1.65–1.85. The thickness of the organic film is selected so that the organic layer will function as the core, whereas the SiO$_2$ layer and air will serve as the cladding. The thin gain medium and the depth of the etched waveguide are such that the optical mode or modes that are guided are isolated from the substrate. A suitable waveguide depth is, for example, 3 μm. The term "cross-coupled" laser may also be used to designate this device. Here, the coupler part cross-couples the laser radiation created in the arms.

The resulting structure may be pumped with a nitrogen laser (having a wavelength of 337 nm). The Alq molecules will absorb this light, and the excitations that are created are transferred to the DCM molecules by Forster transfer. If the excitation intensity is sufficiently high, laser action is created, and the waveguide emission is coupled out of the plane by the two-dimensional square lattice. With a coupler fabricated with the parameters of this example, the laser emission will be at about 640 nm and the light will be output coupled at an angle of approximately 90 degrees relative to the surface plane of the substrate. The geometry described with reference to FIGS. 8A and 8B can also be advantageously employed for the case of the resonant cavity coupler described previously.

Cross-coupled lasers can also be implemented with other types of 2D photonic crystals besides the square lattice described above. For example, a triangular lattice coupled be used for the central coupler portion. In this case, three lasers could be used intersecting at an angle of 120 degrees with respect to each other. In cross-coupled lasers, some of the arms can be passive, e.g., with no optical gain generated in those portions. Additionally, in certain cross-coupled lasers, the different arms may be injection locked to obtain single mode operation. The phenomenon of injection locking is well known in the art.

E. Applications

Figure 9:
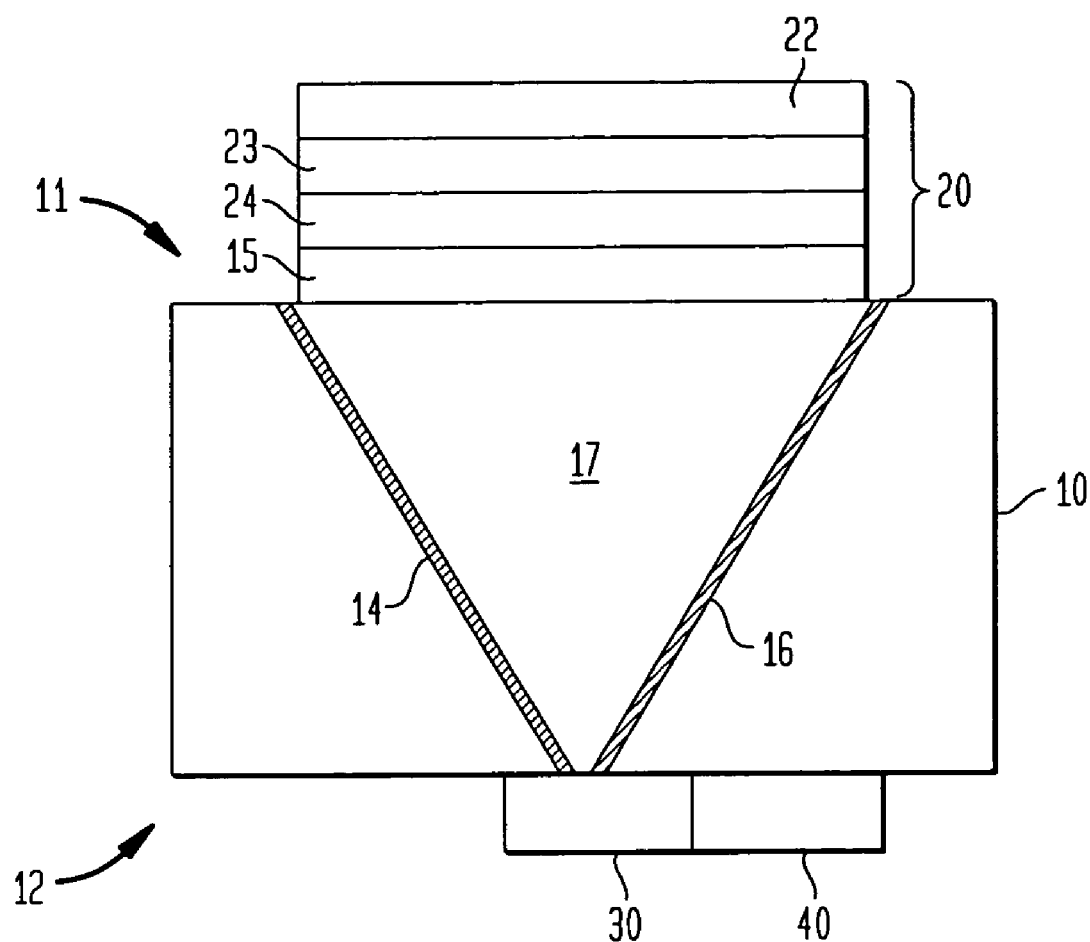
FIG. 9 is a schematic cross-sectional side view of a waveguide laser-coupler device together with a substrate and LED for use as a laser structure illustrating one exemplary application for the two-dimensional coupler.

This inventive laser-coupler configuration may be used in conjunction with a laser structure for achieving electrically-driven lasing, invoking properties of both organic and polymeric LEDs and photoexcited lasers, as described in the '167 application. FIG. 9 shows a schematic cross-sectional side view of a structure for a laser including a waveguide laser-coupler. In FIG. 9, the laser structure includes a substrate 10 having a first side 11 and a second side 12. An LED 20 is fabricated on the first side 11, and a waveguide laser 30 is fabricated on the second side 12. The laser 30 is combined with an output coupler 40 to direct the laser emission in a desired direction. The substrate may be fabricated with glass or plastic and is transparent to visible light. A dielectric quarter wave stack layer 15 may be disposed between the substrate 10 and LED 20. The LED 20 may comprise a planar microcavity LED, as described in A. Dodabalapur et al., "*Physics and Applications of Organic Microcavity Light Emitting Diodes*," J. APPL. PHYS. Vol. 80 (12) (Dec. 15, 1996), at pp. 6954–6964, incorporated herein. The substrate may be configured as described in the '167 application.

The above laser structure represents just one of the many possible applications for the two-dimensional photonic crystal coupler. The coupler may be used with various other lasers and communications devices. For example, with the inventive coupler, light may be received from vertically-emitting sources, such as vertical cavity surface emitting lasers, and coupled into planar waveguides. The couplers may be implemented with lasers based on InP substrates emitting at 1.3 to 1.6 mm useful in optical communications systems, and surface emitting lasers may be used. The couplers or device structures shown in FIGS. 8A and 8B also may be implemented with lasers based on GaN, InGaN and AlGaN, contemplated for use as short wavelength sources (e.g., about <500 nm), useful for many applications including information storage and CDROMs. Again, a surface emitting laser technology can be used. Optically-pumped lasers based on rare-earth doped dielectrics (e.g., erbium doped $SiO_2$) can be used with the two-dimensional couplers, for applications in optical amplifiers and lasers. The invention also can be integrated with quantum cascade lasers useful for mid-infrared wavelengths, and a surface emitting quantum cascade laser can be achieved.

It should be understood that the above-described applications are exemplary only, and that the present invention may be embodied in other specific forms without departing from the spirit or essential attributes therefor. Accordingly, reference should be made to appended claims, rather than to the foregoing specification, as indicating the scope of the invention.

The invention claimed is:

1. An article comprising an optical device and, optically coupled to the device, an optical coupler for receiving light input from the device and outputting light in at least one discrete direction wherein:
   the optical coupler comprises a core region disposed between two cladding regions, the core region having a two-dimensional photonic crystal grating to output the light in the at least one direction.

2. The article of claim 1 in which the device is selected from the group consisting of a distributed feedback laser and a distributed Bragg reflector laser.

3. The article of claim 2 in which the device is an optical waveguide device and the coupler is integrated on the same waveguide as the device.

4. The article of claim 1 in which one of the two cladding regions comprises air.

5. The article of claim 1 in which one of the two cladding regions comprises $SiO_2$.

6. The article of claim 1 in which the core region comprises an organic material.

7. The article of claim 6 in which the core region comprises 8-hydroxyquinoline aluminum doped with a laser dye.

8. The article of claim 1 in which the two-dimensional grating comprises a square or a triangular latticed grating.

9. The article of claim 8 wherein the coupler is ensconced within at least two distributed Bragg reflector mirrors.

10. The article of claim 1 in which the device comprises a laser.

11. The article of claim 10 in which the laser is a waveguide laser and the coupler is integrated on the same substrate as the laser.

12. The article of claim 1 in which the coupler is ensconced between two distributed Bragg reflector lasers.

13. The article of claim 1 in which the coupler is ensconced between a plurality of one-dimensional photonic crystal layers.

14. The article of claim 1 in which the device comprises a vertical cavity surface emitting laser.

15. The article of claim 1 in which the coupler directs the output light to a planar waveguide.

16. The article of claim 1 in which the device is selected from lasers fabricated with InP, GaN, InGaN, AlGaN, InGaAs, InGaAsP, GaAs, and AlGaAs.

17. The article of claim 1 in which the device comprises a quantum cascade laser.

18. An optical communications system comprising the article of claim 1.

* * * * *

UNITED STATES PATENT AND TRADEMARK OFFICE
CERTIFICATE OF CORRECTION

PATENT NO. : 6,975,664 B1
DATED : December 13, 2005
INVENTOR(S) : Ananth Dodabalapur et al.

It is certified that error appears in the above-identified patent and that said Letters Patent is hereby corrected as shown below:

Column 6,
Line 38, replace "10" with -- 1° --.
Line 54, replace "he" with -- $h_e$ --.

Column 7,
Line 50, replace "directions" with -- directions. --.
Line 50, before "may" insert -- With the two-dimensional triangular lattice, six directions --.

Signed and Sealed this

Fourteenth Day of March, 2006

JON W. DUDAS
*Director of the United States Patent and Trademark Office*